United States Patent [19]
Patel

[11] Patent Number: 6,087,697
[45] Date of Patent: *Jul. 11, 2000

[54] RADIO FREQUENCY POWER MOSFET DEVICE HAVING IMPROVED PERFORMANCE CHARACTERISTICS

[75] Inventor: Viren C. Patel, Belle Mead, N.J.

[73] Assignee: STMicroelectronics, Inc., Carrollton, Tex.

[ * ] Notice: This patent is subject to a terminal disclaimer.

[21] Appl. No.: 08/962,342

[22] Filed: Oct. 31, 1997

[51] Int. Cl.[7] .......................... H01L 29/76; H01L 29/94; H01L 31/062; H01L 31/113
[52] U.S. Cl. .......................... 257/329; 257/327; 257/328; 257/334; 257/341
[58] Field of Search .................................. 257/327, 328, 257/329, 333, 334, 331, 341, 401

[56] References Cited

U.S. PATENT DOCUMENTS

| | | |
|---|---|---|
| 4,455,565 | 6/1984 | Goodman et al. ............ 357/23.4 |
| 5,767,550 | 6/1998 | Calafut et al. ............... 257/355 |
| 5,883,412 | 3/1999 | Feria et al. .................. 257/341 |
| 5,894,150 | 4/1999 | Hshieh ........................ 257/335 |

FOREIGN PATENT DOCUMENTS

0119400 A1  9/1984  European Pat. Off. ........ H01L 29/78

*Primary Examiner*—Mahshid Saadat
*Assistant Examiner*—Jesse A. Fenty
*Attorney, Agent, or Firm*—Theodore E. Galanthay; Lisa K. Jorgenson; Renee M. Larson

[57] ABSTRACT

A power MOSFET suitable for use in RF applications and a method for making the same is disclosed. The power MOSFET reduces the gate coverage of the drain region of the device in order to decrease the device gate to drain capacitance $C_{gd}$. A significant portion of the gate overlaying the drain region is eliminated by the removal of a portion of a polysilicon layer that is disposed over a substantial portion of the drain region that resides between the channel portions of the body regions of the device. The resulting open area, that is subsequently covered by an oxide layer, separates the polysilicon gate electrodes of the device. Finally, a metal layer is deposited over the entire structure to form the gate and source electrodes of the device.

14 Claims, 3 Drawing Sheets

RADIO FREQUENCY POWER MOSFET DEVICE HAVING IMPROVED PERFORMANCE CHARACTERISTICS

CROSS REFERENCE TO RELATED APPLICATION

The subject matter of the present application is related to copending U.S. application Ser. No. 08/962,343, filed herewith and having the same filing date, titled "METHOD FOR FABRICATING A RADIO FREQUENCY POWER MOSFET DEVICE HAVING IMPROVED PERFORMANCE CHARACTERISTICS", Docket No. 97-M-27, which is assigned to SGS-Thomson Microelectronics, Inc. and expressly incorporated herein by reference.

FIELD OF THE INVENTION

The present invention relates generally to a semiconductor device for a MOSFET (Metal-Oxide-Semiconductor Field Effect Transistor), and more particularly to a RF (radio frequency) power MOSFET device having improved performance characteristics.

BACKGROUND OF THE INVENTION

Power Metal Oxide Semiconductor Field Effect Transistors (MOSFETs) are commonly used in RF applications such as transmitters and receivers and other products such as plasma generators. For such applications, it is desirable that power MOSFET devices consistently strive to provide higher performance and higher frequency operation.

The performance of a power MOSFET device is closely related to its gate dimensions. A smaller gate has a shorter channel dimension than does a larger gate and the shorter channel dimension of a smaller gate contributes to high gain and efficiency of the device at high frequencies. Power output is directly proportional to the gate periphery. In addition to the channel dimensions of the gate, device performance of a power MOSFET at radio frequencies is also closely related to the capacitances of the device. First, the input capacitance of the MOSFET, referred to as $C_{iss}$, composed of gate capacitances $C_{gs}$, and $C_{gd}$, is critical to transistor performance. Input capacitance $C_{iss}$ is inversely proportional to the maximum frequency of the device, $F_{max}$ and hence $F_t$. Thus, reducing $C_{iss}$ has the effect of increasing the maximum frequency at which the MOSFET can operate as well as the device gain and efficiency. It is therefore desirable to decrease $C_{gs}$ and/or $C_{gd}$ in order to reduce $C_{iss}$. Conversely, it is undesirable to increase either $C_{gs}$ and $C_{gd}$ to the extent that $C_{iss}$ would be increased, for this would have the undesirable effect of producing a corresponding decrease in $F_t$. As is well known in the art, $C_{gs}$ is the gate to source capacitance of the device and $C_{gd}$ is the gate to drain capacitance of the device.

Second, the feedback capacitance of the MOSFET, referred to as $C_{rss}$, is the capacitance from the output to the input of the device and is therefore equal to gate to drain capacitance $C_{gd}$ only. The value of $C_{rss}$ is voltage dependent and is a critical dimension in the design of any power MOSFET application that uses negative feedback to obtain wide band performance.

Vertical, double diffused MOS (VDMOS) devices and in particular TMOS devices, are characterized as having two channel regions under the gate in order to increase the gate periphery to attain higher packaging density so that a higher power per unit area of the device may be achieved. The term "vertical" is descriptive of the fact that currents flow in the vertical direction of the transistor cell. The two channels are separated by an area of a drain under the gate that determines the value of $C_{gd}$. $C_{gd}$ will obviously be decreased by decreasing the portion of the drain under the gate, but this will also serve to increase the drain resistance of the device, thereby degrading device performance, more specifically power and gain. Otherwise altering the drain region under the gate may have other, undesirable effects. For instance, increasing the doping of the drain region under the gate will lower the breakdown voltage of the device.

A typical structure of a prior art vertical MOSFET that utilizes polysilicon as part of the gate region is shown in FIG. 1. FIG. 1 is the prior art FIG. 1 of European patent application 84100812.5, bearing publication number 0119400, was published on Sep. 25, 1984, hereby incorporated by reference. An N--type layer of low impurity concentration is epitaxially grown on low resistivity drain substrate 1 having an N+-type silicon wafer of high impurity concentration to form drain region 2 of high resistivity. Semiconductor wafer 4 is composed of drain substrate 1 together with drain region 2. Next, insulating coating 3 for a gate is formed on a top surface of drain region 2 by thermal oxidation, followed by a polysilicon film that forms gate electrode 5. Portions of the polysilicon film are selectively removed using photo-etching to open source windows. Using a double diffusion method, through the source windows thus formed, well region 6 that operates as a channel is formed. Advantages of applying the double diffusion method to a large number of transistor elements, known in the art, include uniformity in the characteristics of each transistor, improved production yield, and small transistor size. Next, source and well contact regions 7, 8 which diffuse concentrically within well region 6 from the center outward are formed as shown. After completion of the double diffusion process, source electrode 10 is formed along the upper surface of the polysilicon gate electrode 5 through insulating film 9 by vacuum deposition. Finally, drain electrode 11 is formed on the bottom surface of drain substrate 1 as shown.

A problem with the prior art vertical MOSFET of FIG. 1 has to do with the formation of the gate electrode 5 with respect to the drain region 2 and the large gate to drain capacitance $C_{gd}$ that results. Referring again to FIG. 1, it can be seen that these regions are separated only by the thin layer of insulating coating 3, resulting in a large capacitance between the gate and drain regions. The European patent application 84100812.5 is most concerned with high switching speeds and the feedback function that the large $C_{gd}$ will serve from the output of a switching element to its input. The presence of this feedback function introduced by $C_{gd}$ makes it difficult to perform switching at high speeds. Therefore, European patent application 84100812.5, while not concerned with RF power MOSFET device applications, is nonetheless concerned with lowering $C_{gd}$.

European patent application 84100812.5 addresses the large $C_{gd}$ problem by interposing a raised portion of oxide film between the drain region 2 and the polysilicon gate electrode 5. An enlarged portion of oxide film interposed between the drain and gate regions projects up from the drain region towards the gate and has the effect of increasing the distance between gate and drain and therefore decreasing $C_{gd}$. The three embodiments in which an enlarged portion of oxide film is interposed between the drain and gate regions are illustrated in FIGS. 2(I), 3(G), and 4(H), respectively, of the 84100812.5 application.

While the enlarged portion of oxide film does operate to reduce $C_{gd}$, the process required to form the enlarged portion of oxide film requires additional steps directed just to its formation, rendering the process more lengthy. In the first embodiment, shown in FIG. 2(I), it is necessary to form recess portions into which the enlarged portions of oxide film 23 are formed. The enlarged portions of oxide film are in addition to the film of silicon oxide film that is normally disposed between the gate and drain regions. In the second embodiment, shown in FIG. 3(G), thick oxide regions 125 are formed, a silicon nitride film and underlying thin oxide film removed, and then the silicon oxide insulating layer that normally exists between the gate and drain is formed. As in FIG. 2(I), thick oxide regions 125 have the effect of pushing up the peripheral portion of film 123 in order to maximize the distance between the gate and drain. Finally, in the third embodiment, shown in FIG. 4(H), the enlarged oxide bump 226 is formed by actually oxidizing a portion of polysilicon gate electrode 223.

In addition to requiring a complicated manufacturing process to form the enlarged oxide bumps, European patent application 84100812.5 has a most undesirable side effect. As shown in FIGS. 2(I), 3(G), and 4(H), the last step of forming the MOSFET device is to form the source electrode over the polysilicon portions of the gate; the gate electrode itself is not shown. The formation of the source electrode over the entire gate region, however, operates to dramatically increase the gate to source capacitance, $C_{gs}$, of the device.

Such a substantial increase in $C_{gs}$ of the device may not be of concern in the high speed switching technology to which the European patent application 84100812.5, but it cannot be tolerated in RF applications that use power MOSFET devices to which the present invention is directed. As discussed above, the input capacitance of the MOSFET, $C_{iss}$, is inversely proportional to $F_t$ and is therefore a critical parameter of power MOSFET performance. Since $C_{iss}$ is composed of both gate capacitances $C_{gs}$ and $C_{gd}$, an increase in either $C_{gs}$ or $C_{gd}$ that operates to increase $C_{iss}$ will have an adverse effect on power MOSFET device performance. Since the source electrode of the European patent application 84100812.5 operates to substantially increase $C_{gs}$, this is not an acceptable solution for use with power MOSFET devices.

Referring to FIG. 2, another structure of a typical prior art vertical MOSFET is shown. One of the most important distinctions between FIG. 1 and FIG. 2 is that the structure of FIG. 2 does not utilize polysilicon as part of the gate region; rather gate 34 is formed by gate oxide 36 and metal gate electrode 38. FIG. 2 is the prior art FIG. 1 of U.S. Pat. No. 4,455,565, issued on Jun. 19, 1984 to Goodman et al., hereby incorporated by reference. In the figure, the following parts of the MOSFET structure are shown: substrate 12, 14—first surface of substrate 12, 16—second surface of substrate 12, source region 18, body region 20, drain region 22, body/drain P/N junction 23, 24—high conductivity portion of drain region 22, 26—extended drain/region of lower conductivity portion of 22, channel portions 28, drain electrode 30, source electrode 32, and gate region 34 composed of gate oxide 36 and gate electrode 38.

As described in U.S. Pat. No. 4,455,565 at column 2, lines 9 to 37, adjacent source, body and drain regions 18, 20, and 22, respectively, are of alternate conductivity type. For instance, source region 18 is N+, body region 20 is P, and drain region 22 is N+. Drain electrode 30 along the bottom surface 16 of substrate 12 in contact with 24, the relatively high conductivity portion of the drain region 22. Source electrode 32 is in contact with source regions 18 and body regions 20 in areas displaced from channel portions 28. As shown in the figure, gate 34 is disposed on surface 14 over both pair of channel portions 28 and extended drain region 26 between channel portions 28. Gate 34 includes gate oxide 36 over the first surface 14 of substrate 12 and gate electrode 38 formed on gate oxide 36 as shown.

U.S. Pat. No. 4,455,565, like European patent application 84100812.5, is concerned with the gate to drain capacitance $C_{gd}$ but reduces $C_{gd}$ using a different vertical MOSFET method and structure. In the invention of U.S. Pat. No. 4,455,565, illustrated in FIG. 2 of the patent, the portion of gate electrode 38 that overlays the extended drain region 26 disposed between the two channel portions 28 is removed and replaced with an insulated shield electrode. The portions of gate electrode 38 that overlay the channel portions 28 and source regions 28 are maintained. The effect is two gate electrodes separated by an insulated shield electrode that overlays the drain region of the device. This operates to minimize the feedback capacitance by applying a substantially high positive bias and therefore has the desirable effect of decreasing gate to drain capacitance $C_{gd}$.

While this configuration does operate to lower gate to drain capacitance, it is not accomplished without considerable cost. The insulated shield electrode must be maintained at a constant positive bias. Additional circuitry is required to maintain the insulated shield electrode at the constant bias voltage by applying a voltage, usually much larger than the voltage applied to the gate electrodes, to the insulated shield electrode. Column 3, lines 35–39, of the patent disclose that while the gate electrode may be provided with 0 to 30 volts, the insulated gate electrode would be provided with 30 to 60 volts in order to maintain the required constant bias voltage. Thus, even though U.S. Pat. No. 4,455,565 does operate to reduce $C_{gd}$, the additional circuitry required to maintain the insulated shield electrode that makes it possible to achieve the reduced $C_{gd}$ is a definite drawback.

There is therefore an unmet need in the art to be able to reduce the gate to drain capacitance of a MOS transistor device without otherwise adversely affecting the performance of the device or requiring additional circuitry or processing steps that significantly increase manufacturing costs of the device.

SUMMARY AND OBJECTS OF THE INVENTION

It is therefore an object of the present invention to provide a vertical power MOSFET device, suitable for use in RF applications, that substantially reduces the capacitance between the gate and the drain of the device in order to substantially improve the performance of the power MOSFET device, specifically power and gain, at radio frequencies.

It is another object of the present invention to provide a vertical power MOSFET device, suitable for use in RF applications, that substantially reduces the capacity between the gate and the drain of the device without incurring a large increase in the gate to source capacitance of the device.

It is yet another object of the present invention to provide a vertical power MOSFET device having a reduced gate to drain capacitance that is formed using the double diffusion method of the prior art.

It is still another object of the present invention to provide a vertical power MOSFET device that substantially reduces the capacity between the gate and the drain of the device in a manner that is not unduly complicated by additional required steps and procedures.

Therefore, according to a preferred embodiment of the present invention, a power MOSFET suitable for use in RF applications has a structure to decrease the device gate to drain capacitance $C_{gd}$. The gate coverage of the drain is reduced by the removal of a portion of a polysilicon layer formed over a substantial portion of the drain region in order to maximize the drain region area that is not covered by the device gate. The split gate topography of the present invention is formed by placing photo resist over those portions of a polysilicon layer that are to form polysilicon gate electrodes of the device. The region of the polysilicon layer that is not protected by the photo resist is removed so as to form an opening over a substantial portion of the drain region. Next, a contact oxide layer is formed over the device and windows for the metal gate electrodes and source electrodes are formed in the contact oxide layer so as to expose the upper surface of the polysilicon gate electrodes and the source regions, respectively. A metal layer is deposited in the windows to simultaneously form the metal gate electrodes and the source electrodes.

These and other objects of the invention will become apparent from the detailed description of the invention in which numerals used throughout the description correspond to those found in the drawing Figures.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

A method for producing a unique power MOSFET suitable for use in RF applications is disclosed. The power MOSFET reduces the gate coverage of the drain region of the device in order to decrease the device gate to drain capacitance $C_{gd}$. A significant portion of the gate overlaying the drain region is eliminated by the removal of a portion of a polysilicon layer formed over a substantial portion of the drain region in order to maximize the drain region area that is not covered by the device gate. The split gate topography of the present invention is formed by placing photo resist over those portions of a polysilicon layer that are to form polysilicon gate electrodes of the device. The region of the polysilicon layer that is not protected by the photo resist is removed so as to form an opening over a substantial portion of the drain region. Next, a contact oxide layer is formed over the device and windows for the metal gate electrodes and source electrodes are formed in the contact oxide layer so as to expose the upper surface of the polysilicon gate electrodes and the source regions, respectively. A metal layer is deposited in the windows to simultaneously form the metal gate electrodes and the source electrodes.

Figure 1:
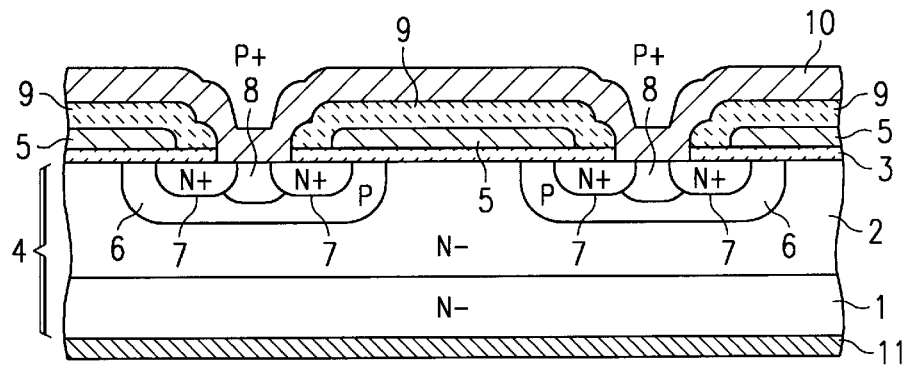
FIG. 1 is a typical structure of a prior art vertical MOSFET that utilizes polysilicon as part of the gate region, according to the prior art.
Figure 2:
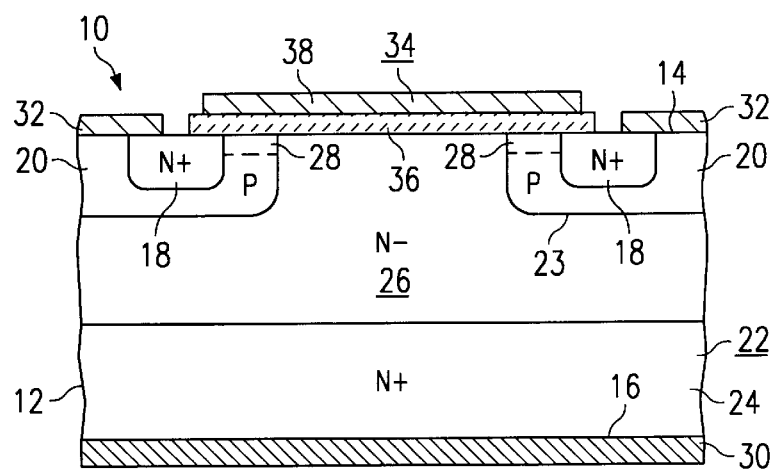
FIG. 2 is a structure of a typical prior art vertical MOSFET that does not utilize polysilicon as part of the gate region, according to the prior art.
Figure 3:
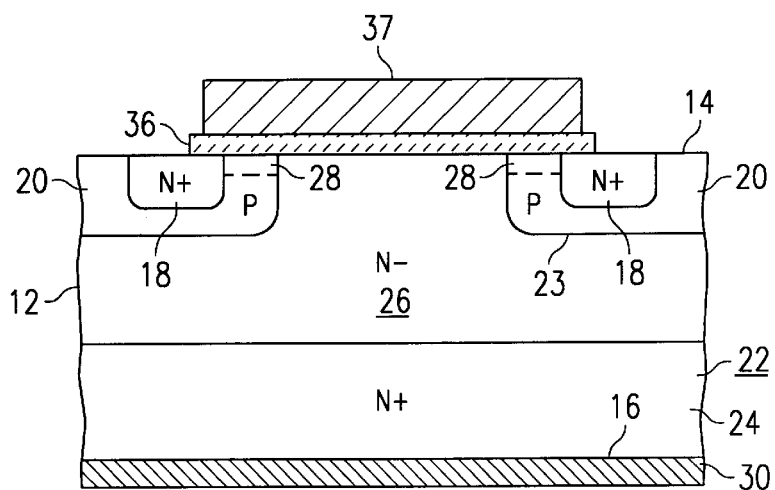
FIGS. 3 to 7 illustrate the processing steps required to produce the power MOSFET device of the present invention.

FIGS. 3 to 7 illustrate the processing steps required to produce the power MOSFET device of the present invention. Referring to FIG. 3, a MOSFET device 10 having a polysilicon layer 37 is shown. It should be noted that FIG. 3 is similar to prior art FIG. 2 of U.S. Pat. No. 4,455,565 with the exception that a polysilicon layer 37, rather than a metal bias electrode, overlays the extended drain region 26 disposed between the two channel portions 28 and that source electrode 32 has not yet been formed.

In the manner known in the art, over substrate 12, an epitaxial region is formed. Gate oxide 36 is grown on the upper surface 14 of substrate 12. Polysilicon is deposited over gate oxide 36, doped, and the polysilicon is cut to define polysilicon layer 37. The polysilicon may be doped with either P or N type material; in this case, the polysilicon is doped with N material. A variety of implant dosages might be used; as an example, a typical implant dosage would be approximately $5 \times 10^{15}$ atoms/cc. Areas of the device not protected by polysilicon layer 37 are doped to form body regions 20 and the device is then heated causing the body regions 20 to extend under the polysilicon layer 37. The extended drain portion 26 is bounded by the body regions 20. The source regions 18 are next formed, in the process forming channel portions 28.

Figure 4:
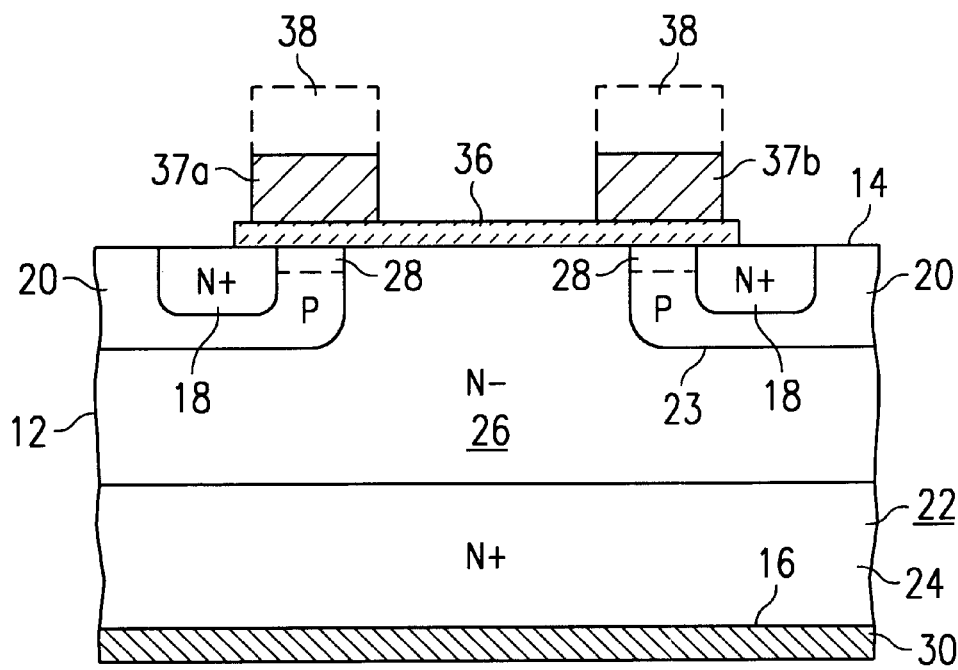
Figure 5:
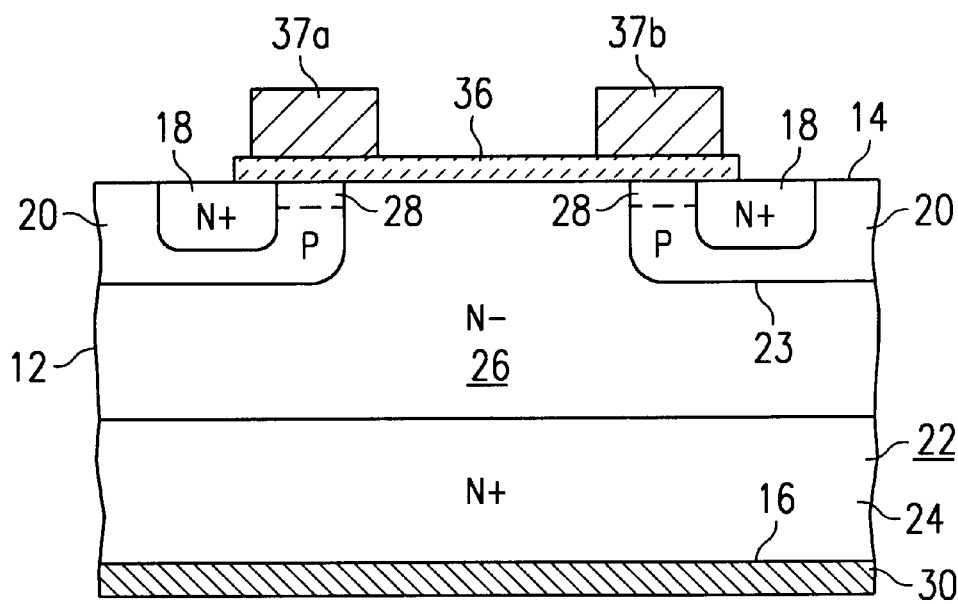

Next, as illustrated in FIG. 4, photo resist 38 is placed over portions of polysilicon layer 37 that define the polysilicon gate electrodes 37a, 37b to be formed later. The placement of photo resist 38 over the portions of the polysilicon layer 37 that define the polysilicon gate electrodes 37a, 37b allows the portion of the polysilicon layer that is not protected to be etched away, as shown in FIG. 4.

The placement of photo resist 38 over polysilicon layer 37 is critical to form polysilicon gate electrodes 37a, 37b having the correct dimensions with respect to the drain and source regions of the power MOSFET device. Each polysilicon gate electrode 37a, 37b is formed to overlay at least a portion of N+ source region 18 and at least a small portion of the N– extended drain region 26 adjacent to channel portion 28 so as to completely overlay channel portion 28. The gate electrode 37a, 37b must completely overlap the channel portion 28 under it and at least a small portion of extended drain region 26 or the gate to be formed cannot function to open channel portion 28. The open area between gate electrodes 37a, 37b, then, covers substantially all of extended drain region 26 that is positioned between channel portions 28 with the exception of the slight overhang of polysilicon gate electrodes 37a, 37b over a small portion of extended drain region adjacent to channel portions 28. The open area over substantially all of extended drain region 26 positioned between channel portions 28 eliminates the gate electrodes over a significant portion of extended drain region 26 between the polysilicon gate electrodes 37a, 37b, thereby eliminating $C_{gd}$ over that area. It is an obvious advantage to decrease the overhang of polysilicon gate electrodes 37a, 37b over extended drain region 26 in order to maximize the presence of nothing over extended drain region 26. However, polysilicon gate electrodes 37a, 37b must always cover at least some minimal portion of extended drain region 26 adjacent to channel portions 28 for the MOSFET device to operate properly.

Figure 6:
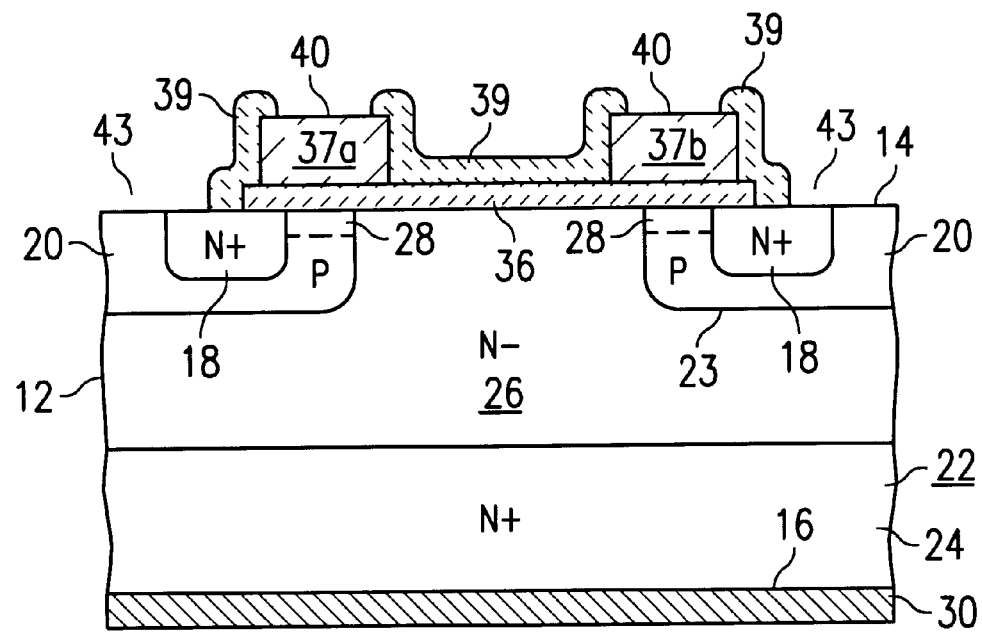

Referring to FIG. 6, a layer of contact oxide 39 in which windows for gate and source electrodes are formed is deposited over the entire structure, including over polysilicon gate electrodes 37a, 37b and exposed portions of gate oxide 36. Openings 40 and 43 are formed in contact oxide layer 39. Openings 40 are formed in contact oxide layer 39 to expose a portion of the upper surface of polysilicon gate electrodes 37a, 37b that will make electrical contact with a metal layer to be deposited later that will form the metal gate electrodes and the source electrodes. Openings 43 are formed in contact oxide layer 39 to expose a portion of the source regions 18 and body regions 20 on the upper surface of substrate 12 that will make electrical contact with a metal layer to be deposited later that will form the metal gate electrodes and the source electrodes. The metal gate electrodes and the source electrodes are formed simultaneously. It is standard practice to place metal silicide between the silicon and metal to obtain an ohmic contact and this is not shown here.

Figure 7:
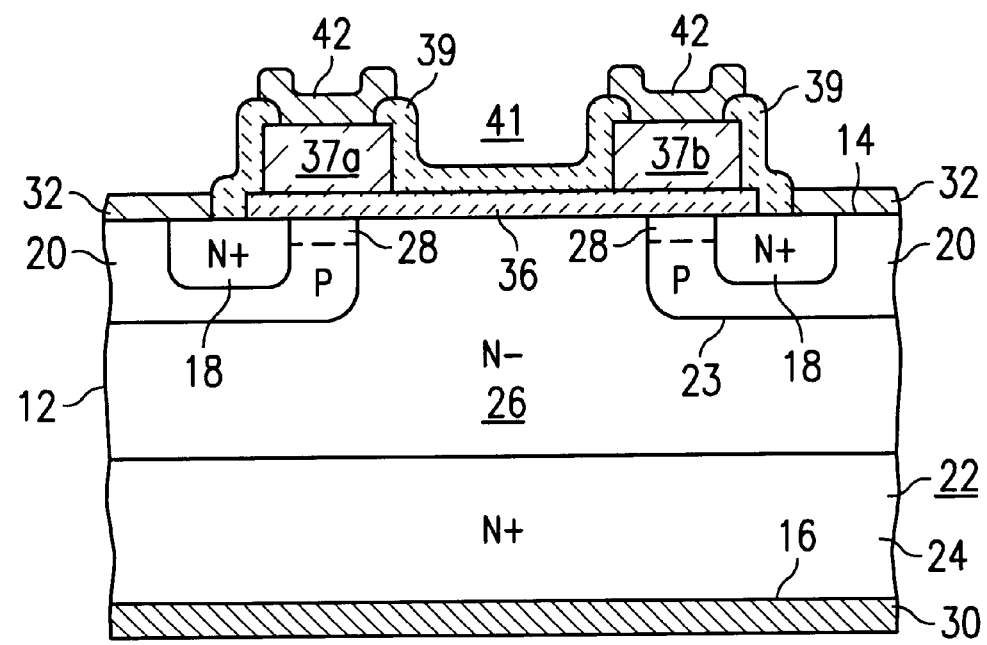

In FIG. 7, a metal layer, typically made of gold or aluminum, is formed over the in the windows 40 and 43 so as to make electrical contact with the exposed portions of polysilicon gate electrodes 37a, 37b and the exposed portions of the source. Metal gate electrode 42 is the metal layer so formed. There is a light undercut of metal gate electrode 42 by oxide layer 39 on the top surface of polysilicon areas 37a, 37b that defines the windows 40 formed in the oxide layer 39. Polysilicon areas 37a, 37b and metal areas 42 together define the gate of the power MOSFET device. It should be further noted that source electrodes 32 are formed at the same time metal gate electrode 42 is formed, as shown in the figure.

Area 41 indicates the area in which polysilicon has been removed and over which there is no metal electrode that bridges the two polysilicon gate electrodes 37a, 37b. Area 41 provides a degree of separation between polysilicon gate electrodes 37a, 37b by eliminating the gate over a substantial portion of the drain to lower the device gate to drain capacitance $C_{gd}$. The present invention lowers $C_{gd}$ by using a very simple process step in place of several complex process steps that would significantly increase manufacturing costs of the device and in this regard, is superior to prior art solutions such as European patent application 84100812.5. Moreover, the present invention lowers $C_{gd}$ without the need for additional circuitry and in this regard is superior to the prior art solution of U.S. Pat. No. 4,455,565.

While the invention has been particularly shown and described with reference to a preferred embodiment, it will be understood by those skilled in the art that various changes in form and detail may be made therein without departing from the spirit and scope of the invention. One skilled in the art will recognize that various manufacturing steps recognized in the art may be used to produce the structure illustrated in FIG. 3.

What is claimed is:

1. A vertical MOSFET device, comprising:
a semiconductor substrate having first and second opposing major surfaces;
a drain region of first conductivity type disposed across the second surface and including an extended drain portion extending to the first surface;
a body region of second conductivity type extending into the substrate from the first surface and being bounded by the extended drain portion;
a source region of first conductivity type extending into the substrate from the first surface within the boundaries of the body region;
a channel portion, defined at the first surface by the source region and the extended drain portion;
a source electrode contacting the source and body regions on the first surface;
a drain electrode contacting the drain region on the second surface;
a polysilicon gate electrode corresponding to the channel portion and disposed on the first surface over the channel portion, at least a portion of the extended drain portion adjacent the channel portion but not over the entire extended drain portion, and at least a portion of the source region; and
a metal gate electrode disposed over the polysilicon gate electrode in a manner to make electrical contact with the polysilicon gate electrode.

2. The device of claim 1, further comprising:
an oxide layer disposed over at least a portion of the upper surface of the polysilicon gate electrode to undercut at least a portion of the metal gate electrode disposed over the polysilicon gate electrode.

3. The device of claim 1, further comprising:
an oxide layer underlying the polysilicon gate electrode on the first surface.

4. The device of claim 3, further comprising:
a source electrode disposed on the first surface adjacent to the oxide layer.

5. A vertical MOSFET device, comprising:
a semiconductor substrate having first and second opposing major surfaces;
a drain region of first conductivity type disposed across the second surface and including an extended drain portion extending to the first surface;
a body region of second conductivity type extending into the substrate from the first surface and being bounded by the extended drain portion;
a source region of first conductivity type extending into the substrate from the first surface within the boundaries of the body region;
a channel portion, defined at the first surface by the source region and the extended drain portion;
a source electrode contacting the source and body regions on the first surface;
a drain electrode contacting the drain region on the second surface;
a polysilicon gate electrode corresponding to the channel portion and disposed on the first surface over the channel portion, at least a portion of the extended drain portion adjacent the channel portion but not over the entire extended drain portion, and at least a portion of the source region;
a metal gate electrode disposed over the polysilicon gate electrode in a manner to make electrical contact with the polysilicon gate electrode; and
a first oxide layer disposed over at least a portion of the upper surface of the polysilicon gate electrode to undercut at least a portion of the metal gate electrode disposed over the polysilicon gate electrode.

6. The device of claim 5, further comprising:
a second oxide layer underlying the polysilicon gate electrode adjacent to the first oxide layer.

7. The device of claim 6, further comprising:
a source electrode disposed on the first surface adjacent to the first oxide layer and over the source region.

8. A vertical MOSFET device, comprising:
a semiconductor substrate having first and second opposing major surfaces;
a drain region of first conductivity type disposed across the second surface and including an extended drain portion extending to the first surface;
a first body region and a second body region of second conductivity type extending into the substrate from the first surface, the first and second body regions being spaced apart by the extended drain portion;

a first source region and a second source region of first conductivity type, the first source region extending into the substrate from the first surface within the boundary of the first body region and the second source region extending into the substrate from the first surface within the boundary of the second body region;

a first channel portion and a second channel portion, defined at the first surface by the first and second source regions and the extended drain portion therebetween;

a source electrode contacting the first and second source regions and the first and second body regions on the first surface;

a drain electrode contacting the drain region on the second surface;

a first polysilicon gate electrode corresponding to the first channel portion and disposed on the first surface over the first channel portion, at least a portion of the extended drain portion adjacent the first channel portion but not over the entire extended drain portion, and at least a portion of the first source region;

a second polysilicon gate electrode corresponding to the second channel portion and disposed on the first surface over the second channel portion, at least a portion of the extended drain portion adjacent the second channel portion but not over the entire extended drain portion, and at least a portion of the second source region; and a first metal gate electrode disposed over the first polysilicon gate electrode in a manner to make electrical contact with the first polysilicon gate electrode and a second metal gate electrode disposed over the second polysilicon gate electrode in a manner to make electrical contact with the second polysilicon gate electrode.

9. The device of claim 8, further comprising:

an oxide layer disposed over at least a portion of the upper surface of the first and second polysilicon gate electrodes to undercut at least a portion of the first and second metal gate electrodes disposed over the first and second polysilicon gate electrodes.

10. The device of claim 8, further comprising:

an oxide layer underlying the first and second polysilicon gate electrodes on the first surface.

11. The device of claim 10, further comprising:

a first source electrode disposed on the first surface adjacent to the oxide layer and overlaying a portion of the first source region and a second source electrode disposed on the first surface adjacent to the oxide layer and overlaying a portion of the second source region.

12. A vertical MOSFET device, comprising:

a semiconductor substrate having first and second opposing major surfaces;

a drain region of first conductivity type disposed across the second surface and including an extended drain portion extending to the first surface;

a first body region and a second body region of second conductivity type extending into the substrate from the first surface, the first and second body regions being spaced apart by the extended drain portion;

a first source region and a second source region of first conductivity type, the first source region extending into the substrate from the first surface within the boundary of the first body region and the second source region extending into the substrate from the first surface within the boundary of the second body region;

a first channel portion and a second channel portion, defined at the first surface by the first and second source regions and the extended drain portion therebetween;

a source electrode contacting the first and second source regions and the first and second body regions on the first surface;

a drain electrode contacting the drain region on the second surface;

a first polysilicon gate electrode corresponding to the first channel portion and disposed on the first surface over the first channel portion, at least a portion of the extended drain portion adjacent the first channel portion but not over the entire extended drain portion, and at least a portion of the first source region;

a second polysilicon gate electrode corresponding to the second channel portion and disposed on the first surface over the second channel portion, at least a portion of the extended drain portion adjacent the second channel portion but not over the entire extended drain portion, and at least a portion of the second source region;

a first metal gate electrode disposed over the first polysilicon gate electrode in a manner to make electrical contact with the first polysilicon gate electrode and a second metal gate electrode disposed over the second polysilicon gate electrode in a manner to make electrical contact with the second polysilicon gate electrode; and a first oxide layer disposed over at least a portion of the upper surface of the first and second polysilicon gate electrodes to undercut at least a portion of the first and second metal gate electrodes disposed over the first and second polysilicon gate electrodes.

13. The device of claim 12, further comprising:

a second oxide layer underlying the first and second polysilicon gate electrodes on the first surface adjacent to the first oxide layer.

14. The device of claim 13, further comprising:

a first source electrode disposed on the first surface adjacent to the first oxide layer and over a portion of the first source region and a second source electrode disposed on the first surface adjacent to the first oxide layer and over a portion of the second source region.

* * * * *